(12) United States Patent
Aleksov et al.

(10) Patent No.: US 9,583,390 B2
(45) Date of Patent: Feb. 28, 2017

(54) ORGANIC THIN FILM PASSIVATION OF METAL INTERCONNECTIONS

(71) Applicant: INTEL CORPORATION, Santa Clara, CA (US)

(72) Inventors: Aleksandar Aleksov, Chandler, AZ (US); Tony Dambrauskas, Chandler, AZ (US); Danish Faruqui, Chandler, AZ (US); Mark S. Hlad, Chandler, AZ (US); Edward R. Prack, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/018,686

(22) Filed: Feb. 8, 2016

(65) Prior Publication Data
US 2016/0155667 A1 Jun. 2, 2016

Related U.S. Application Data

(62) Division of application No. 13/977,663, filed as application No. PCT/US2011/068275 on Dec. 31, 2011, now Pat. No. 9,257,276.

(51) Int. Cl.
*H01L 21/3205* (2006.01)
*H01L 21/78* (2006.01)
(Continued)

(52) U.S. Cl.
CPC ........... *H01L 21/78* (2013.01); *H01L 21/0234* (2013.01); *H01L 21/0271* (2013.01);
(Continued)

(58) Field of Classification Search
CPC ....................................................... H01L 24/14
(Continued)

(56) References Cited

U.S. PATENT DOCUMENTS 4,865,245 A 9/1989 Schulte et al.
6,392,301 B1 5/2002 Waizman et al.
(Continued)

FOREIGN PATENT DOCUMENTS

JP 63079348 4/1988
JP 63079348 A * 4/1988
(Continued)

OTHER PUBLICATIONS

International Search Report and Written Opinion for International Application No. PCT/US2011/068278, dated Nov. 12, 2012, 12 pp. [77.228PCT (ISR & WO)].
(Continued)

*Primary Examiner* — George Fourson, III
(74) *Attorney, Agent, or Firm* — Konrad Raynes Davda & Victor; Alan S. Raynes

(57) ABSTRACT

Electronic assemblies and their manufacture are described. One embodiment relates to a method including depositing an organic thin film layer on metal bumps on a semiconductor wafer, the organic thin film layer also being formed on a surface adjacent to the metal bumps on the wafer. The wafer is diced into a plurality of semiconductor die structures, the die structures including the organic thin film layer. The semiconductor die structures are attached to substrates, wherein the attaching includes forming a solder bond between the metal bumps on a die structure and bonding pads on a substrate, and wherein the solder bond extends through the organic thin film layer. The organic thin film layer is then exposed to a plasma. Other embodiments are described and claimed.

12 Claims, 10 Drawing Sheets

(51) Int. Cl.
*H01L 25/065* (2006.01)
*H01L 25/00* (2006.01)
*H01L 21/56* (2006.01)
*H01L 21/683* (2006.01)
*H01L 21/02* (2006.01)
*H01L 23/498* (2006.01)
*H01L 21/027* (2006.01)
*H01L 21/768* (2006.01)
*H01L 23/00* (2006.01)
*H01L 23/31* (2006.01)

(52) U.S. Cl.
CPC ........ *H01L 21/0273* (2013.01); *H01L 21/563* (2013.01); *H01L 21/6835* (2013.01); *H01L 21/76883* (2013.01); *H01L 23/49894* (2013.01); *H01L 24/11* (2013.01); *H01L 24/16* (2013.01); *H01L 24/81* (2013.01); *H01L 25/0657* (2013.01); *H01L 25/50* (2013.01); *H01L 21/3205* (2013.01); *H01L 23/3142* (2013.01); *H01L 24/05* (2013.01); *H01L 24/13* (2013.01); *H01L 24/14* (2013.01); *H01L 24/17* (2013.01); *H01L 2221/68304* (2013.01); *H01L 2221/68327* (2013.01); *H01L 2224/0401* (2013.01); *H01L 2224/0557* (2013.01); *H01L 2224/05647* (2013.01); *H01L 2224/1147* (2013.01); *H01L 2224/1148* (2013.01); *H01L 2224/11474* (2013.01); *H01L 2224/11849* (2013.01); *H01L 2224/131* (2013.01); *H01L 2224/16057* (2013.01); *H01L 2224/16058* (2013.01); *H01L 2224/16146* (2013.01); *H01L 2224/16225* (2013.01); *H01L 2224/16227* (2013.01); *H01L 2224/17181* (2013.01); *H01L 2224/73204* (2013.01); *H01L 2224/81011* (2013.01); *H01L 2224/81024* (2013.01); *H01L 2224/81026* (2013.01); *H01L 2224/81191* (2013.01); *H01L 2224/81192* (2013.01); *H01L 2224/81203* (2013.01); *H01L 2224/81207* (2013.01); *H01L 2224/81375* (2013.01); *H01L 2224/81801* (2013.01); *H01L 2224/81815* (2013.01); *H01L 2224/831* (2013.01); *H01L 2225/06513* (2013.01); *H01L 2225/06517* (2013.01); *H01L 2225/06541* (2013.01); *H01L 2924/00014* (2013.01); *H01L 2924/3841* (2013.01)

(58) Field of Classification Search
USPC .......................................... 257/737
See application file for complete search history.

(56) References Cited

U.S. PATENT DOCUMENTS

| | | | |
|---|---|---|---|
| 6,420,664 B1 | 7/2002 | Muramatsu et al. | |
| 6,430,058 B1 | 8/2002 | Sankman et al. | |
| 6,495,397 B2 | 12/2002 | Kubota et al. | |
| 6,770,547 B1* | 8/2004 | Inoue | H01L 21/563 |
| | | | 257/E21.503 |
| 7,279,362 B2 | 10/2007 | Li et al. | |
| 7,638,882 B2 | 12/2009 | Sankman | |
| 7,705,447 B2 | 4/2010 | Ganesan et al. | |
| 7,750,469 B2 | 7/2010 | Cho et al. | |
| 7,897,486 B2 | 3/2011 | Li et al. | |
| 8,035,226 B1 | 10/2011 | Wilcoxen et al. | |
| 8,188,594 B2 | 5/2012 | Ganesan et al. | |
| 8,193,072 B2 | 6/2012 | Li et al. | |
| 8,466,559 B2 | 6/2013 | Manepalli et al. | |
| 8,970,034 B2 | 3/2015 | Gandhi | |
| 9,257,276 B2 | 2/2016 | Aleksov et al. | |
| 9,368,437 B2 | 6/2016 | Ganesan et al. | |
| 2001/0042923 A1* | 11/2001 | Yanagida | H01L 21/56 |
| | | | 257/779 |
| 2003/0151140 A1 | 8/2003 | Nishiyama et al. | |
| 2004/0027788 A1* | 2/2004 | Chiu | H01L 21/563 |
| | | | 361/329 |
| 2004/0149479 A1 | 8/2004 | Chiu et al. | |
| 2004/0150104 A1 | 8/2004 | Terui | |
| 2005/0106505 A1 | 5/2005 | Chiu et al. | |
| 2006/0038291 A1 | 2/2006 | Chung et al. | |
| 2006/0175686 A1* | 8/2006 | Murata | H01L 21/0206 |
| | | | 257/642 |
| 2006/0244128 A1* | 11/2006 | Hayashi | H01L 21/4853 |
| | | | 257/712 |
| 2007/0001317 A1* | 1/2007 | Matsuoka | H01L 23/49816 |
| | | | 257/780 |
| 2007/0045840 A1* | 3/2007 | Varnau | H01L 24/11 |
| | | | 257/737 |
| 2007/0045841 A1 | 3/2007 | Cho et al. | |
| 2007/0138635 A1* | 6/2007 | Ikumo | H01L 23/3171 |
| | | | 257/738 |
| 2008/0290136 A1 | 11/2008 | Murayama | |
| 2009/0032941 A1* | 2/2009 | McLellan | H01L 21/563 |
| | | | 257/737 |
| 2009/0057893 A1* | 3/2009 | Iwaki | H01L 24/11 |
| | | | 257/737 |
| 2009/0065931 A1 | 3/2009 | Rangaraj et al. | |
| 2010/0252926 A1* | 10/2010 | Kato | H01L 24/11 |
| | | | 257/738 |
| 2011/0095415 A1 | 4/2011 | Topacio et al. | |
| 2011/0101519 A1 | 5/2011 | Hsiao et al. | |
| 2011/0101527 A1* | 5/2011 | Cheng | H01L 24/11 |
| | | | 257/738 |
| 2011/0122592 A1 | 5/2011 | Ganesan et al. | |
| 2011/0248399 A1 | 10/2011 | Pendse | |
| 2011/0309490 A1* | 12/2011 | Lu | H01L 23/293 |
| | | | 257/737 |
| 2012/0119359 A1* | 5/2012 | Im | H01L 23/49811 |
| | | | 257/737 |
| 2012/0208321 A1* | 8/2012 | Foote | H01L 24/11 |
| | | | 438/115 |
| 2013/0087908 A1 | 4/2013 | Yu et al. | |
| 2014/0138818 A1 | 5/2014 | Aleksov et al. | |
| 2014/0217579 A1 | 8/2014 | Ganesan et al. | |
| 2014/0217585 A1 | 8/2014 | Mallik et al. | |

FOREIGN PATENT DOCUMENTS

| | | |
|---|---|---|
| JP | 2000082716 | 3/2000 |
| JP | 2006261641 | 9/2006 |
| KR | 10-2007-0023268 | 2/2007 |

OTHER PUBLICATIONS

International Preliminary Report on Patentability (IPRP) for International Application No. PCT/US2011/068278, dated Jul. 10, 2014, 8 pp. [77.228PCT (IPRP)].

International Search Report and Written Opinion for International Application No. PCT/US2011/068275, dated Jul. 16, 2012, 9 pp [77.230PCT (ISR & WO)].

International Preliminary Report on Patentability (IPRP) for International Application No. PCT/US2011/068275, dated Jul. 10, 2014, 6 pp. [77.230PCT (IPRP)].

Semblant Global Limited web page about Surface Finish (view from internet archive dated Sep. 3, 2011), https://web.archive.org/web/20110903015700/http://www.semblantglobal.com/technology/surface_finish.html.

Parylene Engineering web page about Properties (view from internet archive dated Sep. 25, 2010), https://web.archive.org/web/20100925182942/http://www.paryleneengineering.com/properties.html.

VP Scientific web page about Parylene (view from internet archive dated Jul. 17, 2011), https://web.archive.org/web/20110717232048/http://www.vp-scientific.com/parylene_properties.htm.

Office Action 1 for U.S. Appl. No. 13/977,658, dated Apr. 16, 2015, 17 pp. [77.228 (OA1)].

(56) References Cited

OTHER PUBLICATIONS

Response to Office Action 1 for U.S. Appl. No. 13/977,658, dated Jul. 16, 2015, 17 pp. [77.228 (ROA1)].
Supplemental Response to Office Action 1 for U.S. Appl. No. 13/977,658, dated Sep. 25, 2015, 9 pp. [77.228 (SROA1)].
Notice of Allowance 1 for U.S. Appl. No. 13/977,658, dated Oct. 13, 2015, 16 pp. [77.228 (NOA1)].
Notice of Allowance 2 for U.S. Appl. No. 13/977,658, dated Feb. 11, 2016, 12 pp. [77.228 (NOA2)].
Office Action 1 for U.S. Appl. No. 13/977,663, dated Feb. 12, 2015, 20 pp. [77.230 (OA1)].
Response to Office Action 1 for U.S. Appl. No. 13/977,663, dated May 12, 2015, 7 pp. [77.230 (ROA1)].
Final Office Action 1 for U.S. App. No. 13/977,663, dated May 27, 2015, 13 pp. [77.230 (FOA1)].
Response to Final Office Action 1 for U.S. Appl. No. 13/977,663, dated Aug. 27, 2015, 8 pp. [77.230 (RFOA1)].
Notice of Allowance for U.S. Appl. No. 13/977,663, dated Oct. 1, 2015, 8 pp. [77230 (NOA1)].

* cited by examiner

ORGANIC THIN FILM PASSIVATION OF METAL INTERCONNECTIONS

This application is a divisional of U.S. patent application Ser. No. 13/977,663 filed Jun. 28, 2013, which is the National Stage of International Application No. PCT/US2011/068275, filed Dec. 31, 2011, wherein all the above applications are hereby incorporated by reference in their entirety.

BACKGROUND

Integrated circuits may be formed on wafers made of materials such as silicon. The wafers are processed to form various electronic devices thereon. Various layers including electrically insulating layers and electrically conducting layers may be deposited on the wafer. The wafers are diced into chips (a chip is also known as a die), which may then be attached to a package substrate using a variety of known methods. The chip attach process may include coupling the die to the package substrate through metal pads on the die and on the substrate.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of electronic device and integrated circuit structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Figure 1A:
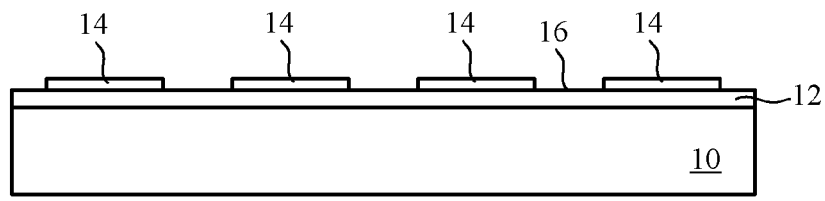
FIG. 1A-1M illustrate operations in a method including forming a passivation layer on an assembly including a TSV device, in accordance with certain embodiments.
Figure 1B:
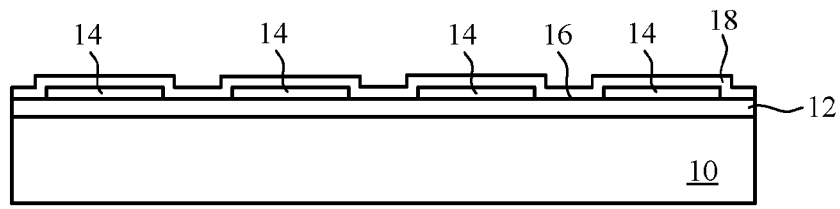

Certain embodiments relate to the passivation of metal bumps or pads used for bonding a device to a substrate. FIGS. 1A-1F illustrate operations of a process for forming an assembly including a TSV (through-silicon-via) device attached to a substrate through solder bumps, in accordance with certain embodiments. FIG. 1A illustrates a portion of a wafer 10 having an interconnect region 12 that may include a plurality of layers of dielectric and metal leading to metal pads or bumps 14 on the surface 16. The bumps 14 may be formed from a metal, for example, copper (Cu). As used herein the term metal includes pure metals and alloys. FIG. 1B illustrates the formation of an organic thin film layer 18 that acts as a passivating layer on the surface 16 including on the bumps 14. The organic thin film layer 18 (also referred to herein as a passivation layer) may in certain embodiments be formed as a vapor deposited layer. Materials for the layer 18 may include, but are not limited to, organic materials including fluoropolymers, silicones, and hydrocarbon polymers. Suitable fluoropolymers may be available from Semblant™, Inc. Suitable hydrocarbon polymers may include, for example, Parylene, available from Specialty Coating Systems™. These materials are resistant to being wet by a solder and as a result act to inhibit the solder from flowing thereon. They are also selected to have relatively high melting points and can protect the underlying metal during various processing operations. For example, the passivation layer can protect the metal from oxidation that may occur during thermal cycling, exposure to adhesives, solvents, water, and atmospheric conditions. Other methods to inhibit oxidation, such as processing in a carefully controlled reducing atmosphere, the use of excess flux, and the like, add complexity and costs to the processing operations.

The passivation layer 18 may be vapor deposited using any suitable method, including, but not limited to, chemical vapor deposition (CVD) and plasma vapor deposition (PVD), and may be formed in certain embodiments to be a homogeneous layer having a thickness in the range of 5 nm to 120 nm. Other embodiments may form the layer 18 to a thickness in the range of 1 nm to 200 nm. Other thicknesses are also possible.

Figure 1C:
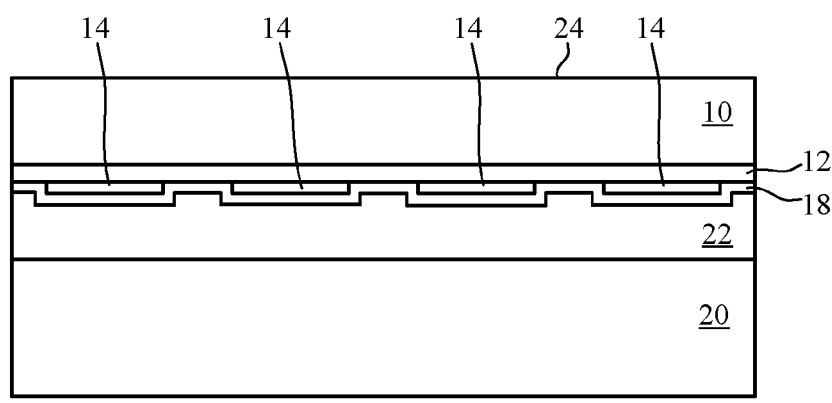
Figure 1D:
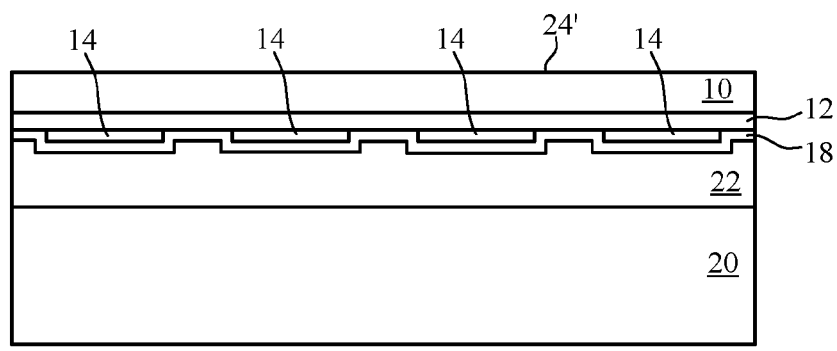
Figure 1E:
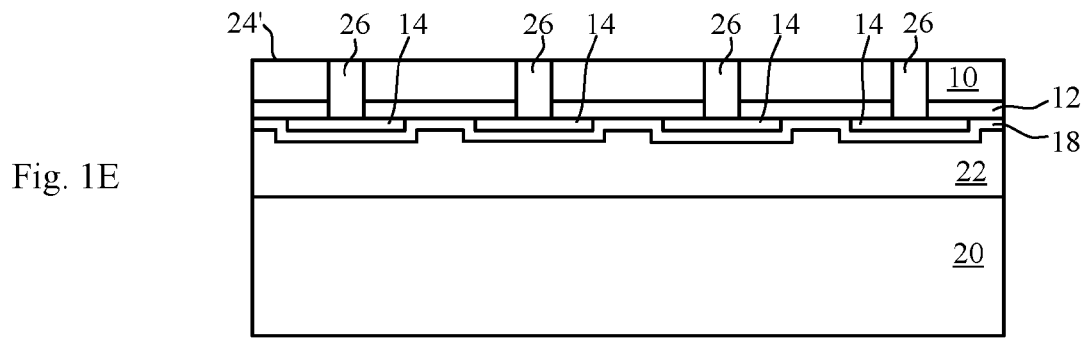
Figure 1F:
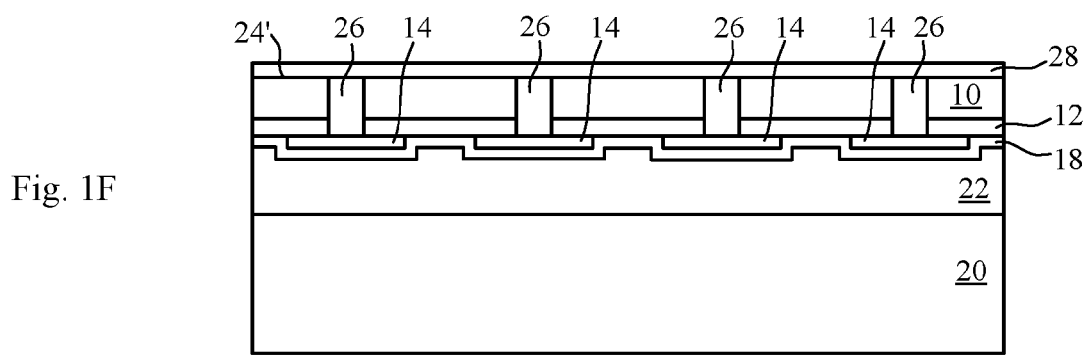

FIG. 1C illustrates bonding the coated device to a carrier wafer 20, using an adhesive 22. Any suitable wafer and adhesive may be used for holding the device wafer 10 while thinning the back side 24 of the wafer 10. FIG. 1D illustrates the thinned wafer 10. FIG. 1E illustrates forming through silicon vias 26 (TSV's) in the wafer, using any suitable method. The TSV's 26 extend from the thinned back side 24' of the wafer to contact the bonding pads 14. The TSV's 26 include an electrically conductive material such as a metal therein. FIG. 1F illustrates forming another passivation layer 28 on the back side 24' of the wafer and on the TSV's 26. In certain embodiments, the passivation layer 28 may be the same material and the same thickness as passivation layer 18.

Figure 1G:
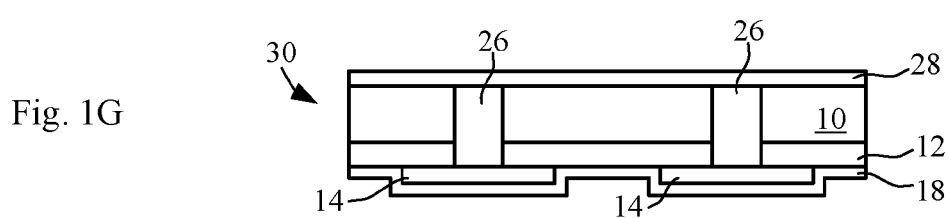
Figure 1H:
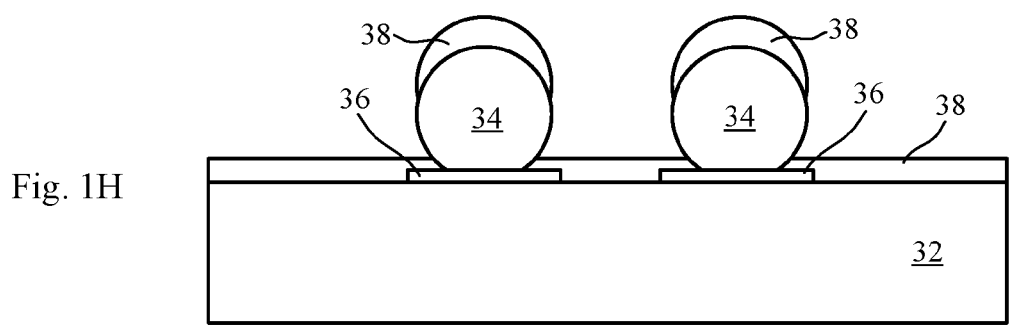
Figure 1I:
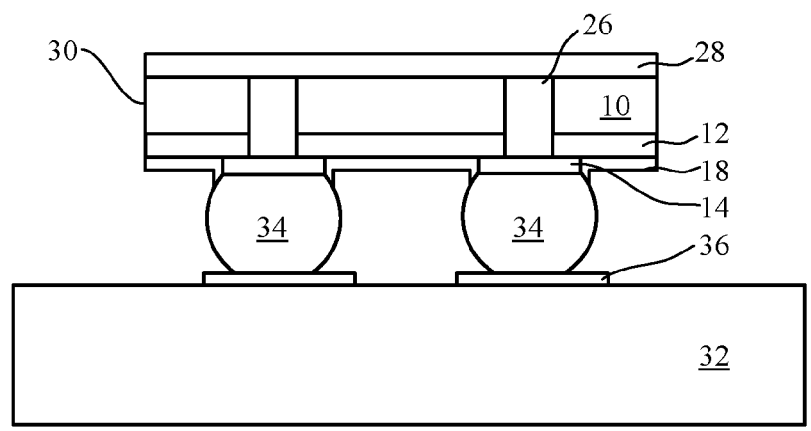
Figure 1J:
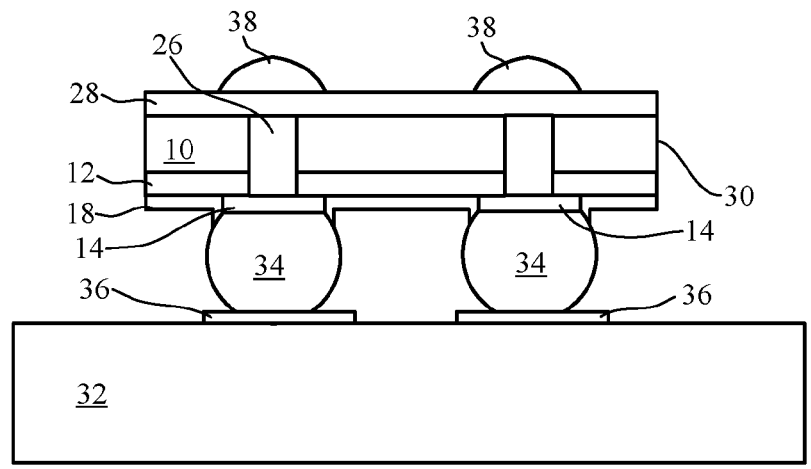

As illustrated in FIG. 1G, the wafer 10 may be debonded from the carrier wafer 20 and diced into individual die structures 30 using any suitable methods. The die structure 30 may then be coupled to a substrate such as the substrate 32 illustrated in FIG. 1H. The substrate 32 may include solder balls 34 on bonding pads 36. Any suitable method for attachment may be used, including the use of a flux 38 and heat to solder through the passivation layer 18. The flux 38 may be placed onto the solder balls 34, bonding pads 36, and the surface of the substrate 32. The flux 38 may assist in a soldering operation to form a solder connection to the bonding pads 14 on the die structure 30. The flux 38 may in certain embodiments be a no clean flux. Thermosonic thermal compression bonding may also be used to couple the die structure 30 to the substrate 32. The resultant assembly is illustrated in FIG. 1I, showing the solder connection to the bonding pads 14. It should be appreciated that the geometry of the solder as it extends between the bonding pads may differ from that illustrated herein. As illustrated in FIG. 1J, for example, the solder connection between the pads 14 and 36 has a convex sidewall shape. The shape could alternatively, for example, be concave or have relatively straight sidewalls.

Figure 1K:
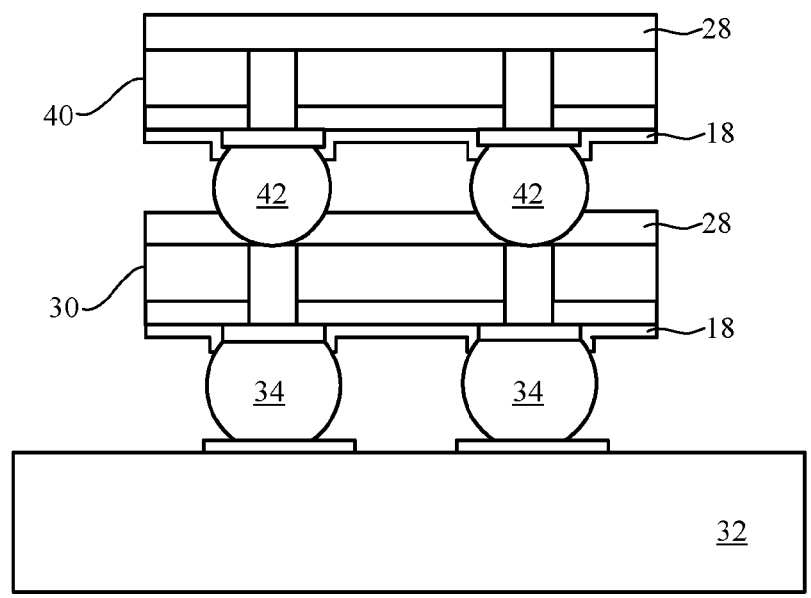
Figure 1L:
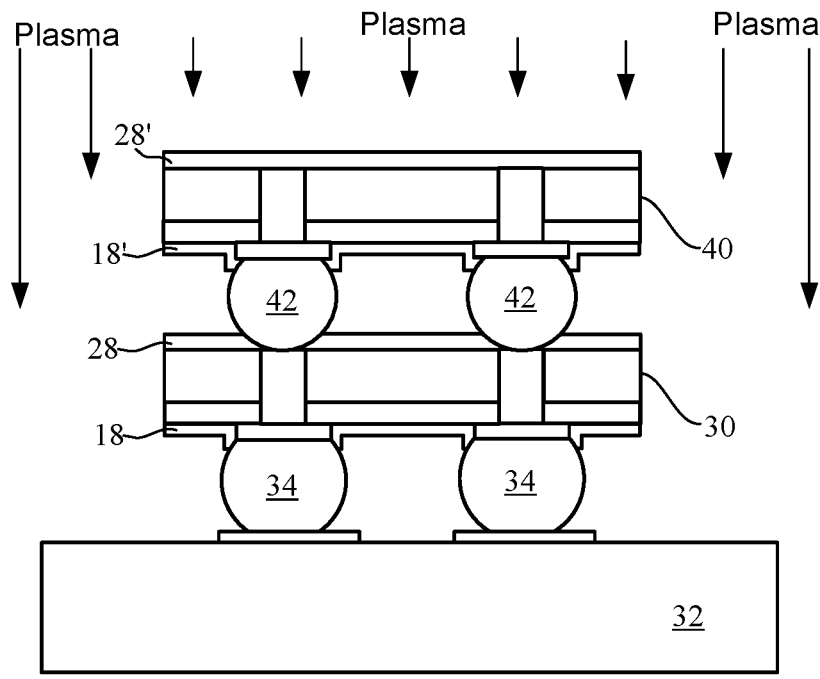
Figure 1M:
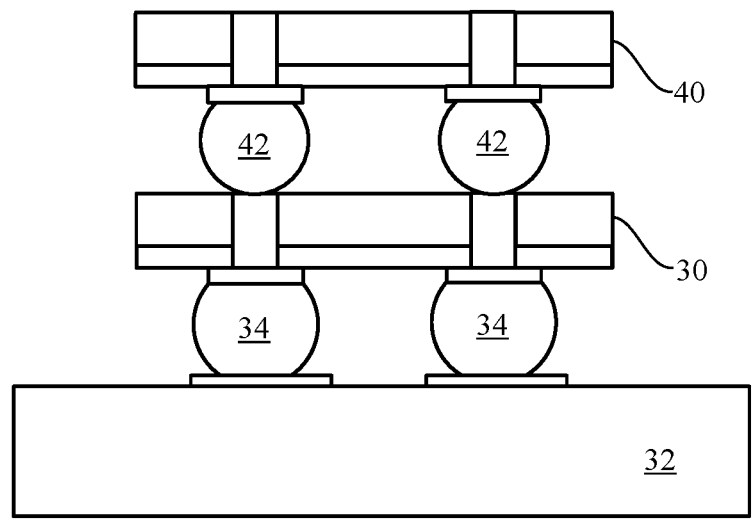

Flux 38 may be positioned on the passivation layer 28 on the die structure 30, as illustrated in FIG. 1J, so that an additional die structure 40 may be coupled to the die structure 30. The additional die structure 40, as illustrated in FIG. 1K, may include the same layer structure as the die structure 30, and be coupled thereto through the passivation layer 28 and include solder bumps 42, using a suitable method such as described above. In other embodiments, the additional die structure need not have a similar structure to the die structure 30. A treatment to remove or modify the passivation layers 18, 28 remaining on the die structures 30, 40 may be carried out so that additional processing operations such as, for example, underfill and encapsulation, may be carried out. If the passivation layers 18, 28 are not removed or modified, the subsequent layers such as underfill may not adequately wet the structures 30, 40 to form a good bond thereto. In certain embodiments, the treatment to remove or modify the surface layers 18, 28 is an $O_2$ (oxygen), $N_2$ (nitrogen), Ar (argon), $H_2$ (hydrogen), $CF_4$ (carbon tetrafluoride), $SF_6$ (sulfur hexafluoride), or $CHF_3$ (trifluoromethane) plasma treatment, which acts to remove the thin film passivation layer or modifies its surface energy to make the surfaces hydrophilic. FIG. 1L illustrates the plasma treatment, with the arrows indicating the presence of the plasma. The plasma will generally take the form of a cloud that can reach the surfaces between the die structures 30, 40 and between the die structure 30 and the substrate 32 to interact therebetween. Any suitable plasma method may be utilized. FIG. 1M illustrates an assembly after the plasma treatment. In the illustrated embodiment, the passivation layers 18, 28 on die structures 30, 40 have been removed by the plasma treatment.

Figure 2A:
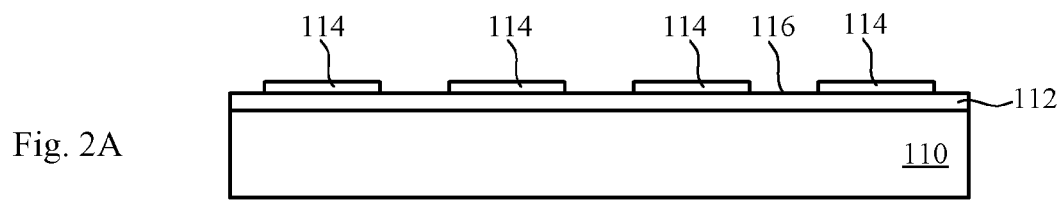
FIGS. 2A-G illustrate operations in a method including forming a passivation layer on an assembly, in accordance with certain embodiments.
Figure 2B:
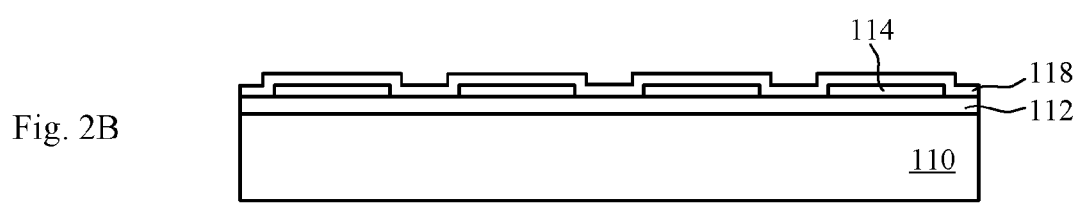
Figure 2C:
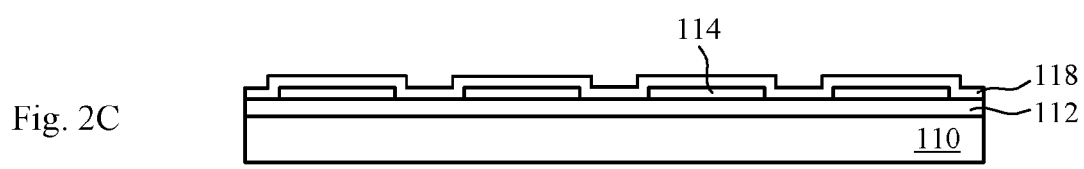
Figure 2D:
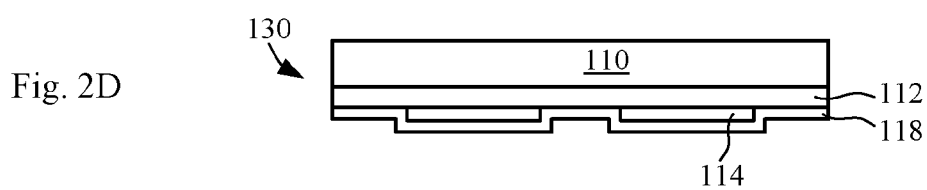

FIGS. 2A-2G illustrate operations of a process to protect first level interconnect bump metallization in accordance with certain embodiments. Certain operations are similar to those described above. FIG. 2A illustrates a portion of a wafer 110 having an interconnect region 112 that may include a plurality of layers of dielectric and metal leading to bumps 114 on the surface 116. FIG. 2B illustrates the formation of a passivation layer 118 on the surface 116 including on the bumps 114. The passivation layer 118 may be the same material and thickness as the passivation layer 18 described above. If desired, the wafer 110 may be thinned, as illustrated in FIG. 2C. The thinning process may be carried out as described above, using a carrier wafer. The wafer 110 may then be diced into semiconductor die structures 130, as illustrated in FIG. 2D.

Figure 2E:
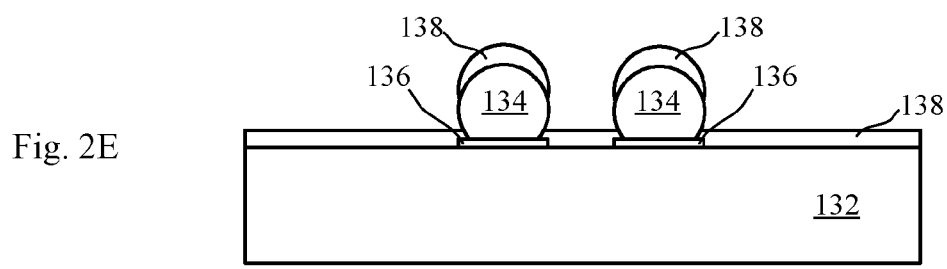
Figure 2F:
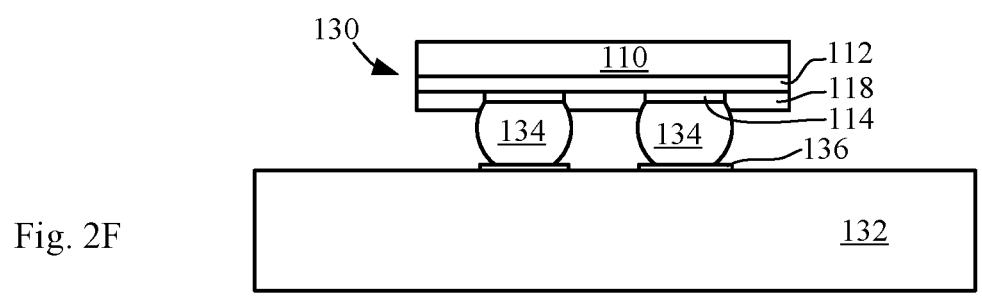
Figure 2G:
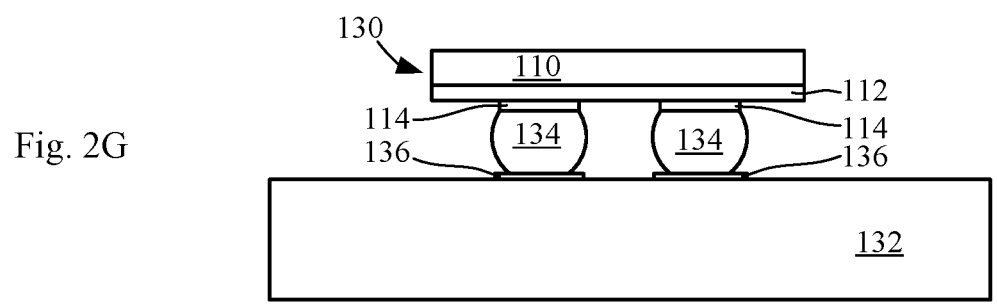

The die structure 130 may then be coupled to a substrate such as the substrate 132 illustrated in FIG. 2E. The attachment process may be similar to that described above. The substrate 132 may include solder balls 134 on bonding pads 136. A flux 138 may be placed onto the solder balls 134, bonding pads 136, and the surface of the substrate 132. Any suitable process to solder through the passivation layer 118 and form a bond to the pads 114 may be utilized. In certain embodiments thermosonic thermal compression bonding may be carried out. The resultant assembly is illustrated in FIG. 2F, showing the solder ball 134 connection to the bonding pads 114. A plasma treatment such as described above may then be carried out to remove or modify the remaining passivation layer 118. As illustrated in FIG. 2G, the passivation layer 118 has been removed by the plasma treatment.

FIGS. 3A-3G illustrate operations of a process to form a passivation layer on a portion of a die structure, in accordance with certain embodiments. In certain embodiments, the process acts to protect part of the die structure and enables careful control of the size and position of solder on the die. This may be accomplished using a thin film passivation layer and a photoresist material during certain processing procedures. In addition, in certain embodiments, the operations described in connection with FIGS. 3A-3G may act to replace dielectric encapsulation procedures because the sides of the bonding pads and the regions between the bonding pads on the die are passivated before the solder attachment process.

Figure 3A:
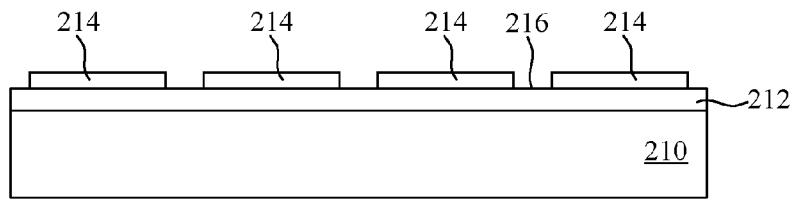
FIGS. 3A-3G illustrate operations in a method including forming a passivation layer on portions of a device, in accordance with certain embodiments.
Figure 3B:
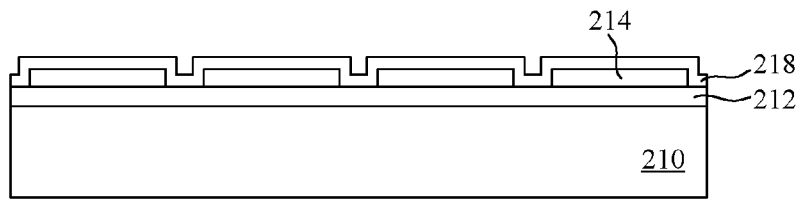
Figure 3C:
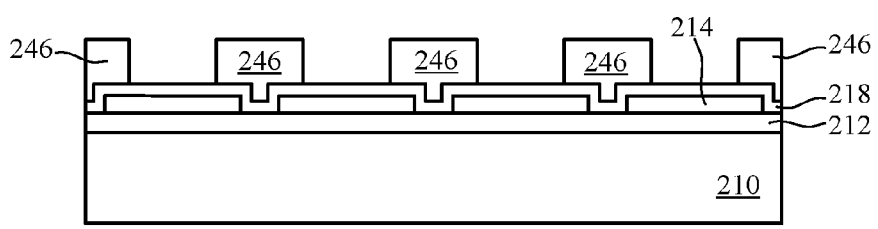
Figure 3D:
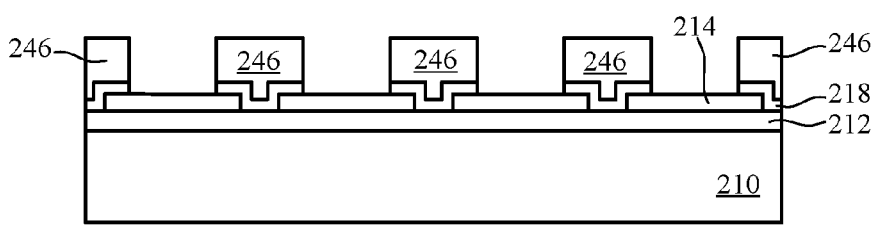

FIG. 3A illustrates a portion of a wafer 210 having an interconnect region 212 that may include a plurality of layers of dielectric and metal leading to bumps 214 on the surface 216. The bumps 214 may comprise copper (Cu) bumps having a relatively large width. FIG. 3B illustrates the formation of a passivation layer 218 on the surface 216 including on the bumps 214. The passivation layer 218 may be selected from the same materials and thicknesses as the passivation layer 18 described above. If desired, the wafer 210 may be thinned. FIG. 3C illustrates a patterned photoresist layer 246 made up of a photoresist material that was deposited on the passivation layer 218 and then developed to form a pattern of openings over the bumps 214. The passivation layer 218 may be removed from the portion of the metal bumps 214 not covered by the photoresist layer using any suitable method, including, for example, a reactive plasma treatment in $O_2$ or $CF_4$. The openings are formed so that a central region of the bump 214 is uncovered and outer regions are covered by the passivation layer 218 and the photoresist layer 246, as illustrated in FIG. 3D. The resultant structure enables the subsequent use of solder that will remain in place on the exposed portion of the metal bump 214 during reflow.

Figure 3E:
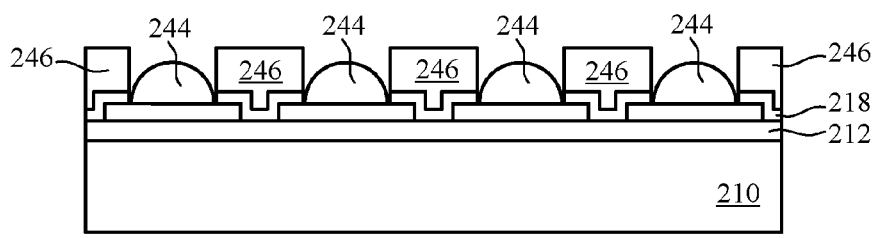
Figure 3F:
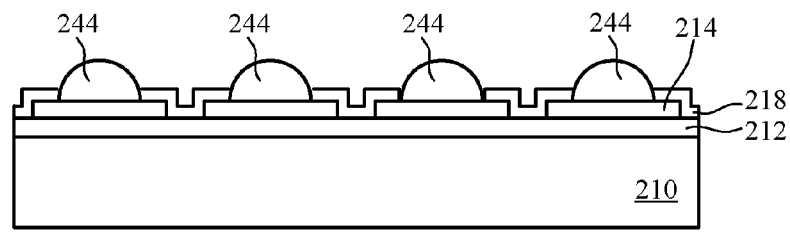

As illustrated in FIG. 3E, solder 244 may be positioned on the exposed portion of the metal bumps 214 and reflowed to form a bond to the bumps metal 214. The solder 244 may take the form of a solder bump or ball. During reflow, the width of the solder 244 on the metal bump 214 is limited by the passivation layer 218 positioned on the outer region on the metal bump 214. Thus the passivation layer 218 may act to control the position and the width of the solder 244. The photoresist 246 may in certain embodiments be removed and in other embodiments remain on the structure. In embodiments having the photoresist 246 remain on the structure, the photoresist and passivation layer act to protect the metal bump 214 and act to encapsulate the region between the metal bumps 214. In embodiments where the photoresist 246 is removed (for example, for height reasons), the passivation layer 218 acts to encapsulate the region between the solder bumps 244. FIG. 3F illustrates the structure with the photoresist layer 246 removed and the passivation layer 218 positioned between the solder bumps 244 on the Cu bumps 214.

Figure 3G:
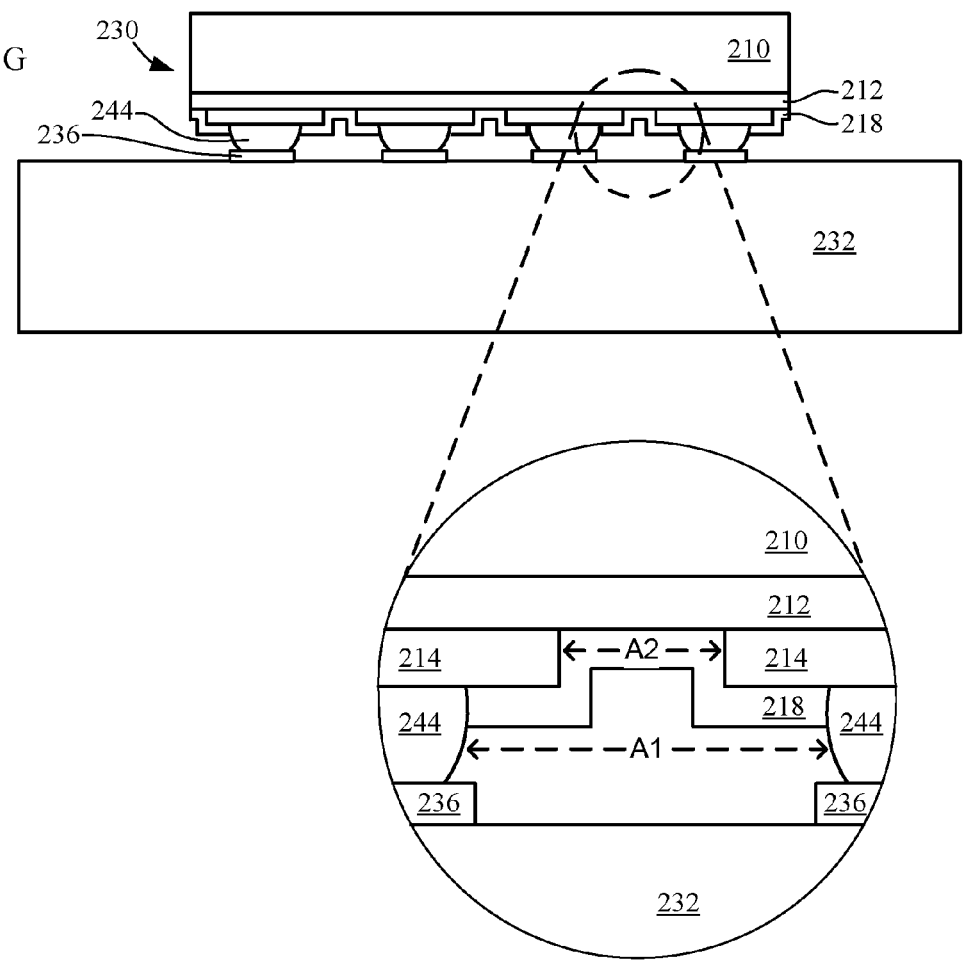

FIG. 3G illustrates an assembly after chip attach to the package substrate. The die structure 230 is coupled to pads 236 on the package substrate 232 through solder bumps 244. Between the solder bumps 244 (and between the die Cu bumps 214) is the passivation layer 218. The passivation layer 218 acts to encapsulate the region between the solder bumps 244. As illustrated in the blown-up view in the embodiment illustrated in FIG. 3F, the distance A1 shows a relatively large spacing between the solder joints that are between the die structure 230 and the substrate 232. By keeping this distance A1 relatively large, there is a lower risk of solder bridging between adjacent bumps and a lower risk of electrical shorts occurring. In addition, the distance A2 shows a relatively small spacing between the Cu bumps 214. This results in lower interlayer dielectric stress because the Cu bumps can cover a larger amount of the surface of the interconnect region 212. Keeping the A1 distance greater than the A2 distance leads to reduced stress to the die from the joint, and the passivation layer 218 protects the region between the solder joints on the die structure 230.

In certain alternative embodiments, the solder bumps 244 may be formed on a substrate and then the die structure 230 is coupled to the substrate 232 through the bumps 244. In one such embodiment, the process flow would be similar to that illustrated in FIGS. 3A-3C, the photoresist 246 would be removed prior to the solder interconnect operation. The resultant structure would appear similar to that illustrated in FIG. 3G.

Figure 4:
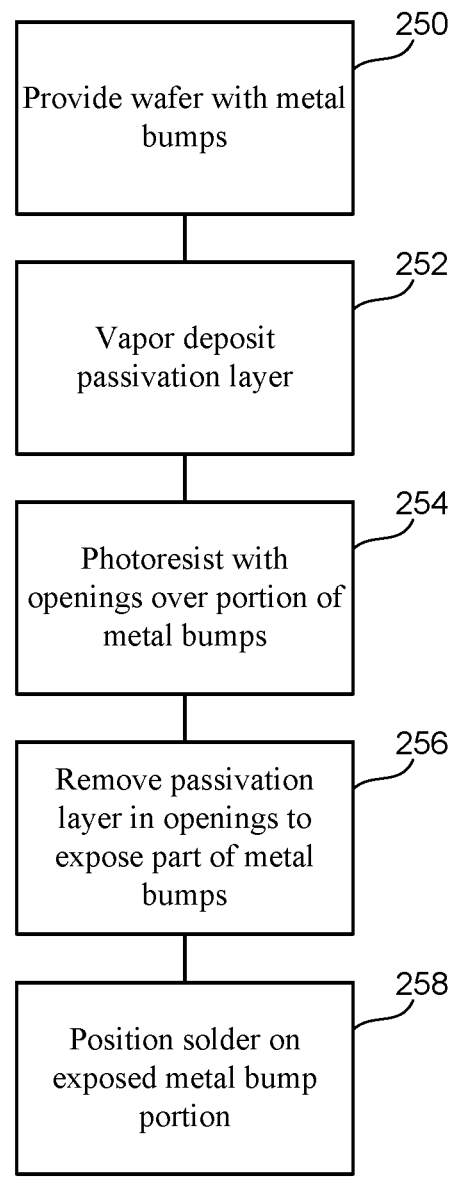
FIG. 4 illustrates a flow chart of operations for processing a device, in accordance with certain embodiments.

A flowchart of operations in accordance with certain embodiments is set forth in FIG. 4. Box 250 is providing a wafer having with bumps thereon. The metal bumps may in certain embodiments comprise Cu. Box 252 is vapor depositing a thin passivation layer. The thin passivation layer may in certain embodiments be an organic material selected from fluoropolymers, silicones, and hydrocarbon polymers. Box 254 is depositing a photoresist layer over the surface including the metal bumps and forming openings in the photoresist over a portion of the bumps, so that part of each of the bumps is covered with photoresist and part is uncovered by the photoresist. The passivation layer is between the photoresist and the bumps at this juncture of the process. Box 256 is removing the passivation layer in the openings to expose part of the metal bumps. This may be accomplished using any suitable method, for example, plasma etching. The passivation layer remains on the part of the metal bumps that is covered by the photoresist. Box 258 is positioning solder on the exposed metal bump portion. The solder may be reflowed and the passivation layer remaining on the metal bumps defines a width of the solder because the solder is inhibited from flowing thereon due to the properties of the passivation layer. Certain embodiments may remove the photoresist layer after positioning the solder, whereas other embodiment may leave the photoresist layer on the structure.

It should be appreciated that many changes may be made within the scope of the embodiments described herein. The term die as used herein refers to a workpiece that is transformed by various process operations into a desired electronic device. A die is usually singulated from a wafer, and wafers may be made of semiconducting, non-semiconducting, or combinations of semiconducting and non-semiconducting materials.

Figure 5:
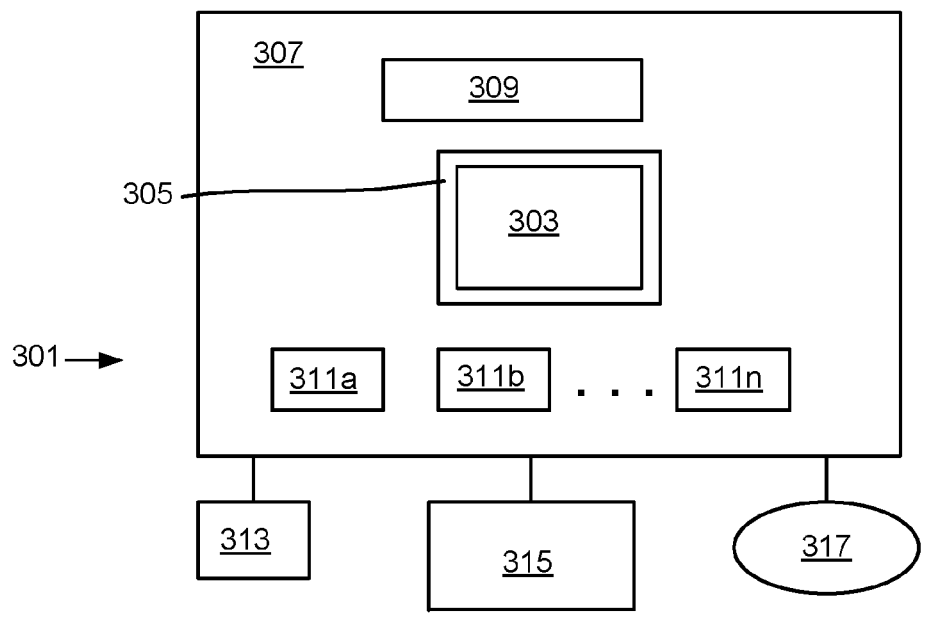
FIG. 5 illustrates an electronic system arrangement in which embodiments may find application.

Assemblies including structures formed as described in embodiments above may find application in a variety of electronic components. FIG. 5 schematically illustrates one example of an electronic system environment in which aspects of described embodiments may be embodied. Other embodiments need not include all of the features specified in FIG. 5, and may include alternative features not specified in FIG. 5.

The system 301 of FIG. 5 may include at least one central processing unit (CPU) 303. The CPU 303, also referred to as a microprocessor, may be a die attached to a package substrate 305, which is then coupled to a printed circuit board 307 (for example, a motherboard). The CPU 303, and the CPU 303 coupled to the package substrate 305, are examples of assemblies that may be formed in accordance with embodiments such as described above. A variety of other system components, including, but not limited to, memory and other components discussed below, may also include structures formed in accordance with embodiments such as described above.

The system 301 may further include memory 309 and one or more controllers 311a, 311b . . . 311n, which are also disposed on the motherboard 307. The motherboard 307 may be a single layer or multi-layered board which has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in sockets or may be connected directly to a printed circuit board or all integrated in the same package. A display 315 may also be included.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The system 301 may comprise any suitable computing device, including, but not limited to, a mainframe, server, personal computer, workstation, laptop, handheld computer, netbook, tablet, book reader, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 311a, 311b . . . 311n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

Terms such as "first", "second", and the like, may be used herein and do not necessarily denote any particular order, quantity, or importance, but are used to distinguish one element from another. Terms such as "top", "bottom", "upper", "lower", and the like may be used for descriptive purposes only and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
   depositing an organic thin film layer on metal bumps on a semiconductor wafer, the organic thin film layer also being formed on a surface adjacent to the metal bumps on the semiconductor wafer;
   dicing the semiconductor wafer into a plurality of semiconductor die structures, the semiconductor die structures including the organic thin film layer;
   attaching the semiconductor die structures to substrates, wherein the attaching includes forming a solder bond between the metal bumps on a semiconductor die structure and bonding pads on a substrate, and wherein the solder bond extends through the organic thin film layer; and
   exposing the organic thin film layer to a plasma.

2. The method of claim 1, wherein the depositing an organic thin film layer comprises vapor depositing a layer selected from the group consisting of fluoropolymers, silicones, and hydrocarbon polymers.

3. The method of claim 2, wherein the depositing the organic thin film layer comprises depositing a homogenous layer.

4. The method of claim 1, wherein the metal bumps comprise Cu.

5. The method of claim 1, wherein the exposing the organic thin film layer to a plasma comprises removing the organic thin film layer.

6. The method of claim 1, wherein the exposing the organic thin film layer to a plasma comprises modifying the organic thin film layer to become more hydrophilic.

7. The method of claim 1, wherein the depositing the organic thin film layer comprises forming the organic thin film layer to a thickness in a range of 5 nm to 120 nm.

8. The method of claim 1, wherein the depositing the organic thin film layer comprises forming the organic thin film layer to a thickness in a range of 1 nm to 200 nm.

9. The method of claim 1, further comprising thinning the semiconductor wafer after the depositing the organic thin film layer.

10. The method of claim 9, further comprising forming vias extending through the semiconductor wafer after the thinning the semiconductor wafer.

11. The method of claim 10, further comprising depositing an organic thin film layer over the vias on a back surface of the semiconductor wafer.

12. The method of claim 11, further comprising, after the dicing the semiconductor wafer, coupling a component to one of the semiconductor die structures, wherein the component is coupled to the back surface of the one of the semiconductor die structures.

* * * * *